US006531267B2

(12) United States Patent
Oberlander

(10) Patent No.: US 6,531,267 B2
(45) Date of Patent: Mar. 11, 2003

(54) PROCESS FOR PRODUCING ACID SENSITIVE LIQUID COMPOSITION CONTAINING A CARBONATE

(75) Inventor: Joseph E. Oberlander, Phillipsburg, NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

(21) Appl. No.: 09/833,224

(22) Filed: Apr. 11, 2001

(65) Prior Publication Data

US 2002/0187439 A1 Dec. 12, 2002

(51) Int. Cl.[7] .......................... G03F 7/32; B01D 39/00; B01D 15/00; C02F 1/42; G21F 9/04
(52) U.S. Cl. ................... 430/327; 430/331; 210/502.1; 210/660; 210/661; 210/679; 210/681; 210/688; 210/767
(58) Field of Search ................................ 430/327, 331; 210/502.1, 669, 661, 679, 681, 688, 767

(56) References Cited

U.S. PATENT DOCUMENTS

| | | | |
|---|---|---|---|
| 4,606,824 A | | 8/1986 | Chu et al. .................... 210/635 |
| 4,784,937 A | * | 11/1988 | Tanaka et al. ............... 430/331 |
| 5,122,440 A | * | 6/1992 | Chien .......................... 430/328 |
| 5,286,606 A | * | 2/1994 | Rahman et al. ............. 430/331 |
| 5,525,315 A | * | 6/1996 | Burke .......................... 210/688 |
| 5,702,611 A | * | 12/1997 | Gronbeck et al. ........... 210/688 |
| 5,750,031 A | * | 5/1998 | Rahman et al. ............. 210/685 |
| 5,955,570 A | * | 9/1999 | Rahman et al. ............. 210/688 |
| 6,103,122 A1 | | 8/2001 | Hou et al. ................. 210/502.1 |

FOREIGN PATENT DOCUMENTS

| | | | |
|---|---|---|---|
| JP | 11-218937 | * | 8/1999 |
| WO | WO 99 39246 A | | 8/1999 |

OTHER PUBLICATIONS

Joseph E. Oberlander et al, "Development of an Edge Bead Remover (EBR) for Thick Films", XP–008004601, SPIE, vol. 4345 (2001), pp. 475–483.
International Search Report.

* cited by examiner

Primary Examiner—Richard L. Schilling
(74) Attorney, Agent, or Firm—Krishna G. Banerjee

(57) ABSTRACT

Disclosed is a method for producing an acid sensitive liquid composition. The method involves passing an acid sensitive liquid composition containing a carbonate represented by the formula $ROC(=O)OR^1$ wherein $R$ and $R^1$ independently are a hydrocarbyl group of 1 to about 10 carbon atoms, through at least one of the following two filter sheets: (a) a filter sheet containing a self-supporting fibrous matrix having immobilized therein a particulate filter aid and a particulate ion exchange resin having an average particle size of from about 2 to about 10 microns, wherein the particulate filter aid and ion exchange resin particles are distributed substantially uniformly throughout a cross-section of said matrix; and/or (b) a filter sheet containing a self-supporting matrix of fibers having immobilized therein particulate filter aid and binder resin, and having an average pore size of about 0.05 to 0.5 $\mu$m. Also disclosed is a method for treating a film of a photoresist composition disposed on a surface, which involves contacting the photoresist composition with an acid sensitive liquid composition prepared by the aforementioned method, in an amount sufficient to produce a substantially uniform film thickness of the photoresist composition across the film surface.

29 Claims, No Drawings

PROCESS FOR PRODUCING ACID SENSITIVE LIQUID COMPOSITION CONTAINING A CARBONATE

FIELD OF THE INVENTION

The present invention provides a process for producing an acid sensitive liquid composition suitable for use in photoresist compositions, or for processing photoresist compositions. The process involves removing metal ion impurities from an acid sensitive liquid composition comprising a carbonate by passing the acid sensitive liquid composition through one or more filter sheets. One of the filter sheets comprising a self-supported fibrous matrix having immobilized therein particulate filter aid and particulate ion exchange resin. The other filter sheet comprises a self supporting matrix of cellulose fibers having immobilized therein particulate filter aid and binder resin, but not containing any ion exchange resin embedded therein.

BACKGROUND OF THE INVENTION

Photoresist compositions are used in microlithography processes for making miniaturized electronic components, such as in the fabrication of computer chips and integrated circuits. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked-coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed (in the case of positive photoresist) or the unexposed (in the case of negative photoresist) areas of the coated surface of the substrate.

Metal ion contamination has been a problem for a long time in the fabrication of high density integrated circuits, computer hard drives and computer chips, often leading to increased defects, yield losses, degradation and decreased performance. In plasma processes, metal ions such as sodium and iron, when they are present in a photoresist, can cause contamination especially during plasma stripping. However, these problems can be overcome to a substantial extent during the fabrication process, for example, by utilizing HCl gettering of the contaminants during a high temperature anneal cycle.

As electronic devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease because of the presence of what would be considered very low levels of metal ions. As the plasma stripping process is repeated, more degradation of the device frequently occurs. A primary cause of such problems has been found to be metal ion contamination in the photoresist, particularly sodium and iron ions. Metal ion levels of than 100 ppb (parts per billion in the photoresist have sometimes been found to adversely affect the properties of such electronic devices. Impurity levels in photoresist compositions have been and are currently controlled by (1) choosing materials for photoresist compositions which meet strict impurity level specifications and (2) carefully controlling the photoresist formulation and processing parameters to avoid the introduction of impurities into the photoresist composition. As photoresist applications become more advanced, tighter impurity specifications must be made.

Liquid compositions useful as components of photoresist compositions or for use in processing photoresist compositions include solvents, developers, rinsers, thinners, and edge bead removers. In producing sophisticated semiconductor devices, it has become increasingly important to provide liquid compositions having metal ion contamination levels below 50 ppb each. The present invention provides a method for producing a liquid composition having very low metal ion concentrations.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron is quite common. In addition, it is almost always desirable that the developed photoresist wall profiles be near vertical relative to the substrate. Such demarcations between developed and undeveloped areas of the resist coating translate into accurate pattern transfer of the mask image onto the substrate.

U.S. Pat. No. 6,103,122 discloses a filter sheet which comprises a self-supporting fibrous matrix having immobilized therein particulate filter aid and particulate ion exchange resin, wherein said particulate filter aid and particulate ion exchange resin are distributed substantially uniformly throughout a cross-section of said matrix. A process for removing ionic impurities from a photoresist solution, which comprises passing the photoresist solution through said filter sheet to remove ionic impurities therefrom is also disclosed in this patent.

U.S. patent application Ser. No. 09/693,215, filed Oct. 20, 2000, discloses an edge bead remover for a photoresist composition disposed as a film on a surface, consisting essentially of a solvent mixture comprising from about 50 to about 80 parts by weight, based on the weight of the solvent mixture, of at least one di($C_1$–$C_3$) alkyl carbonate and from about 20 to about 50 parts by weight, based on the weight of the solvent mixture, of cyclopentanone. This application also discloses a method for treating a photoresist composition film disposed on a surface which method comprises contacting the photoresist composition with a solvent mixture, in an amount sufficient to produce a substantially uniform film thickness of the photoresist composition across the surface, wherein the solvent mixture comprises from about 50 to about 80 parts by weight, based on the weight of the solvent mixture, of at least one di($C_1$–$C_3$) alkyl carbonate and from about 20 to about 50 parts by weight, based on the weight of the solvent mixture, of cyclopentanone.

SUMMARY OF THE INVENTION

The present invention provides a method for producing an acid sensitive liquid composition, said method comprising the step of:
 passing an acid sensitive liquid composition comprising a carbonate represented by the formula ROC(=O)OR$^1$ wherein R and R$^1$ independently are a hydrocarbyl group of 1 to about 10 carbon atoms, through at least one of the following two filter sheets:
  (a) a filter sheet comprising a self-supporting fibrous matrix having immobilized therein a particulate filter aid and a particulate ion exchange resin, said ion exchange resin having an average particle size of from about 2 to about 10 micrometers ($\mu$m), wherein said particulate filter aid and ion exchange resin particles are distributed substantially uniformly throughout a cross-section of said matrix; and/or
  (b) a filter sheet comprising a self-supporting matrix of fibers having immobilized therein a particulate filter aid and a binder resin, said filter sheet having an average pore size of about 0.0.05 to 0.5 $\mu$m; thereby producing the acid sensitive liquid composition.

The present invention also provides a method for treating a film of a photoresist composition disposed on a surface, said method comprising contacting said photoresist composition with an acid sensitive liquid composition prepared by the aforementioned method, in an amount sufficient to produce a substantially uniform film thickness of said photoresist composition across said film surface.

DESCRIPTION OF THE PREFERRED EMBODIMENTS

The present invention provides a method for producing an acid sensitive liquid composition. One step of the present method involves passing an acid sensitive liquid composition comprising a carbonate represented by the formula ROC(=O)OR$^1$ wherein R and R$^1$ independently are a hydrocarbyl group of 1 to about 10 carbon atoms, and in one embodiment 1 to 5 carbon atoms, through at least one of two filter sheets described hereinbelow.

As used herein, the term "hydrocarbyl substituent" or "hydrocarbyl group" is used in its ordinary sense, which is well-known to those skilled in the art. Specifically, it refers to a group having a carbon atom directly attached to the remainder of the molecule and having predominantly hydrocarbon character. Examples of hydrocarbyl groups include:

(1) hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form an alicyclic radical);

(2) substituted hydrocarbon substituents, that is, substituents containing non-hydrocarbon groups which, in the context of this invention, do not alter the predominantly hydrocarbon substituent (e.g., halo (especially chloro and fluoro), hydroxy, alkoxy, mercapto, alkylmercapto, nitro, nitroso, and sulfoxy);

(3) hetero substituents, that is, substituents which, while having a predominantly hydrocarbon character, in the context of this invention, contain other than carbon in a ring or chain otherwise composed of carbon atoms. Heteroatoms include sulfur, oxygen, nitrogen, and encompass substituents as pyridyl, furyl, thienyl and imidazolyl. In general, no more than two, preferably no more than one, non-hydrocarbon substituent will be present for every ten carbon atoms in the hydrocarbyl group; typically, there will be no non-hydrocarbon substituents in the hydrocarbyl group.

In one embodiment, R and R$^1$ are independently methyl or ethyl, and in one embodiment, both R and R$^1$ are methyl (i.e., the carbonate is dimethyl carbonate), and in one embodiment both R and R$^1$ are ethyl (i.e., the carbonate is diethyl carbonate).

In one embodiment, the acid sensitive liquid composition of the present invention further comprises at least one solvent. The solvent may be any solvent commonly known to be useful in formulating photoresist compositions, or other nonpolar hydrocarbon solvents. Useful solvents include, without limitation, propylene glycol methyl ether acetate (PGMEA), 3-methoxy-3-methyl butanol, 2-heptanone (methyl amyl ketone), ethylene glycol monomethyl ether, ethylene glycol monoethyl ether, diethylene glycol monoethyl ether, propylene glycol methyl ether (PGME), ethylene glycol monoethyl ether acetate, ethylene glycol monomethyl acetate or a monooxymonocarboxylic acid ester, such as methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, ethoxy ethyl propionate, methyl 3-oxypropionate, ethyl 3-oxypropionate, methyl 3-methoxypropionate, ethyl 3-methoxypropionate, methyl 2-oxypropionate, ethyl 2-oxypropionate, ethyl 2-hydroxypropionate (ethyl lactate), ethyl 3-hydroxypropionate, propyl 2-oxypropionate, methyl 2-ethoxypropionate, propyl 2-methoxy propionate, cyclopentanone, cyclohexanone, and mixtures thereof. Of these, the most preferred solvents are propylene glycol methyl ether acetate (PGMEA), propylene glycol methyl ether (PGME), cyclopentanone, cyclohexanone, and ethyl 2-hydroxypropionate (ethyl lactate).

In one embodiment, the liquid composition comprises from 50 to 80 weight % carbonate, and 20 to 50 weight % solvent, based on the total weight of the liquid composition. In one embodiment, the ratio of the carbonate to the solvent, by weight is in the range of from 60:40 to 80:20, and in one embodiment from 65:35 to 80:20, and in one embodiment from 70:30 to 80:20, and in one embodiment the ratio is 75:25.

One filter sheet (a) of the present invention comprises comprises a self-supporting fibrous matrix having immobilized therein a particulate filter aid and a particulate ion exchange resin, the ion exchange resin having an average particle size of from about 2 to about 10 microns, wherein said particulate filter aid and ion exchange resin particles are distributed substantially uniformly throughout a cross-section of said matrix. The particulate aid of the filter sheet is preferably acid-washed. The acid used for acid washing is preferably a mineral acid, such as hydrochloric acid, formic acid, acetic acid, propionic acid, butyric acid, oxalic acid, succinic acid, sulfonic acid, and nitric acid. This type of filter sheet is preferably one that is described in U.S. Pat. No. 6,103,122, and is available commercially from CUNO Incorporated (Meriden, Conn., U.S.A.), under the name Zeta Plus® 40Q.

Particulate ion exchange resins which can be utilized in the above filter sheet include cation exchange resins, anion exchange resins, and mixtures thereof. Cation exchange resins which may be employed in the preparation of the filter sheet are not particularly limited. Suitable cation exchange resins include sulfonated phenol-formaldehyde condensates, sulfonated phenol-benzaldehyde condensates, sulfonated styrene-divinyl benzene copolymers, sulfonated methacrylic acid-divinyl benzene copolymers, and other types of sulfonic or carboxylic acid group-containing polymers. It should be noted that cation exchange resins are typically supplied with $H^+$ counter ions, $NH_4^+$ counter ions or alkali metal, e.g., $K^+$ and $Na^+$ counter ions. Preferably, the cation exchange resin utilized herein will possess hydrogen counter ions. One preferred particulate cation exchange resin is Microlite PrCH available from Purolite (Bala Cynwyd, Pa.). This is a sulfonated styrene-divinyl benzene copolymer having a $H^+$ counter ion.

Suitable anion exchange resins are known in the art and are disclosed, for example, in Samuelson, *Ion Exchange Separations In Analytical Chemistry*, John Wiley & Sons, New York, 1963, Ch. 2. The preferred anion exchange resins are those resins having a hydroxide counter ion whereby hydroxide is introduced into the photoresist composition during the exchange process. Hence, preferred anion exchange resins are those resins having quaternary ammonium hydroxide exchange groups chemically bound thereto, e.g., styrene-divinyl benzene copolymers substituted with tetramethylammoniumhydroxide. A preferred anion exchange resin is crosslinked polystyrene substituted with quaternary ammonium hydroxide such as the ion exchange resins sold under the trade names AMBERLYST® A-26-OH by Rohm and Haas Company and DOW G51-OH by Dow Chemical Company.

There are various types of particulate filter aids that can be advantageously employed in the filter sheet above, including diatomaceous earth, magnesia, perlite, talc, colloidal silica, polymeric particulates such as those produced by emulsion or suspension polymerization, e.g., polystyrene, polyacrylates, poly (vinyl acetate), polyethylene, (or other such materials as described in Emulsions and Emulsion Technology, Lissant, Kenneth J., Marcel Dekker, 1974), activated carbon, molecular sieves, clay, and the like.

Suitable self-supporting fibrous matrix which may be utilized in the above filter sheet include polyacrylonitrile filbers, nylon filbers, rayon fibers, polyvinyl chloride fibers, cellulose fibers, such as wood pulp and cotton, and cellulose acetate fibers.

In one embodiment, the filter sheet (a) further comprises a binder resin. Binder resins suitable for use in the filter sheet include melamine formaldehyde colloids such as those disclosed in U.S. Pat. Nos. 4,007,113 and 4,007,114, polyamido-polyamine epichlorhydrin resins such as those disclosed in U.S. Pat. No. 4,859,340 and polyalkylene oxides such as those disclosed in U.S. Pat. No. 4,596,660. Polyamido-polyamine epichlorohydrin resins are preferred, and can be obtained commercially, such as PolyCup™ 1884, 2002 or S2063 (Hercules), Cascamide™ Resin pR-420 (Borden) and Nopcobond™ 35 (Nopco).

In one embodiment, the above filter sheet has an average pore size of about 0.5 to 1.0 $\mu$m.

The second filter sheet (b) of the present invention is a filter sheet comprising a self-supporting matrix of fibers having immobilized therein particulate filter aid and binder resin, the filter sheet having an average pore size of 0.05 to 0.5 $\mu$m, and in one embodiment, 0.2 $\mu$m.

The self supporting fibrous matrix can comprise fiber selected from the group consisting of polyacrylonitrile fiber, nylon fiber, rayon fiber, polyvinyl chloride fiber, cellulose fiber and cellulose acetate fiber. Preferably, the self-supporting matrix is a matrix of cellulose fibers. The cellulose fibers are preferably derived from a cellulose pulp mixture comprising an unrefined cellulose pulp having a Canadian Standard Freeness of from about +400 to about +800 ml., and a highly refined cellulose pulp having a Canadian Standard Freeness of from +100 to about −600 ml, as disclosed in U.S. Pat. No. 4,606,824.

This filter sheet preferably does not contain any ion exchange resin embedded therein, and is preferably available commercially from CUNO Incorporated (Meriden, Conn., U.S.A.), under the tradename Zeta Plus® 020 EC, and described in U.S. Pat. No. 4,606,824.

The present method involves passing the aforementioned acid sensitive liquid composition comprising the carbonate through the filter sheet. The acid sensitive liquid composition may be passed through either one of the filter sheets, or through both filter sheets, in any order. That is, the acid sensitive liquid composition may be passed only through the filter sheet (a), only through the filter sheet (b), through the filter sheet (a), followed by the filter sheet (b), or through the filter sheet (b), followed by the filter sheet (a).

In one embodiment, the acid sensitive liquid composition of the present invention, after passing through at least one of the filter sheets ((a) and (b)), has a concentration of sodium and iron ions that is less than 50 parts per billion (ppb) each, and in one embodiment less than 25 ppb, and in one embodiment, less than 10 ppb.

In one embodiment, the acid sensitive liquid composition of the present invention, after passing through at least one of the filter sheets ((a) and (b)), has a concentration of halide ion (such as fluoride, chloride, bromide, iodide) that is less than 200 ppb.

In one embodiment, the acid sensitive liquid composition of the present invention, after passing through at least one of the filter sheets ((a) and (b)), has a concentration of at least one of the following anions that is less than 200 ppb: $NO_2^-$, $NO_3^-$, $PO_4^{3-}$, $SO_4^{2-}$, and $HSO_4^-$. Metallic coatings can often be corroded by the presence of these anions in them, and an edge bead remover is often used on a metallic coating.

The present invention has an advantage in that the acid-senisitive carbonate is not decomposed while it is being passed through the filter sheet. The use of other ion exchange techniques leads to decomposition of carbonates, and is not desired. The carbonate decomposition can be monitored by an increase in alcohol content (alcohol is produced from the carbonate decomposition) and other decomposition products.

The present invention also provides a method for treating a photoresist composition film disposed on a surface, the method comprising contacting the photoresist composition with a liquid composition prepared by the aforementioned method, in an amount sufficient to produce a substantially uniform film thickness of the photoresist composition across the film surface. As such, the liquid composition is an edge bead remover (EBR). The present invention therefore provides a method for producing an EBR.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Example 1

A one-gallon polypropylene container was set up with two in-line filters connected in series. The first filter is a 47 millimeter Zeta Plus® 40Q disc filter sheet (obtained from CUNO Incorporated (Meriden, Conn., U.S.A.)), followed by a Zeta Plus® 020 EC disc filter sheet (average pore size 0.2 $\mu$m). The following liquids being passed through the filter system were maintained at room temperature, and a flow rate of about 30 milliliters/minute (ml/min.) was used to pass the liquids through the filter system. Nitrogen pressure was used to force the liquids through the filter system. The filter set up was first cleaned with two 500-ml rinses of anhydrous 2-propanol. It was then rinsed by passing 300 ml electronic grade dimethyl carbonate through the filter set up. Thereafter, 450 ml of a liquid composition that was a 75:25 mixture by weight of dimethyl carbonate and cyclopentanone respectively was passed through the filter set up at a rate of 30 ml/min. Samples were removed periodically at 0, 2, 6, 10, and 14 minutes and monitored for metal ion levels by atomic absorption spectroscopy. The results are shown in Table 1. "Control" refers to the unfiltered liquid composition.

TABLE 1

| Time (minutes) | Sodium (ppb) | Potassium (ppb) | Iron (ppb) |
|---|---|---|---|
| 0 (Control) | 14 | 3 | 146 |
| 2 | 1 | 1 | 1 |
| 6 | 1 | 1 | 1 |
| 10 | 1 | 1 | 2 |
| 14 | 2 | 1 | 2 |

Analysis of the samples by gas chromatography (GC) showed no increase in methanol (expected if decomposition of dimethyl carbonate takes place) content or other decomposition products, indicating that no undesirable decomposition of dimethyl carbonate by the filter media.

Example 2

The same procedure as Example 1 was followed, except that the final liquid composition passed through the filter set up was the same sample of dimethyl carbonate (instead of the mixture of dimethyl carbonate and cyclopentanone) that was previously passed through the filter set up. Samples were removed periodically at 0, 2, 6, 10, and 16 minutes and monitored for metal ion levels by atomic absorption spectroscopy. The results are shown in Table 2. "Control" refers to the unfiltered liquid composition.

TABLE 2

| Time (minutes) | Sodium (ppb) | Potassium (ppb) | Iron (ppb) | % dimethyl carbonate[1] |
|---|---|---|---|---|
| 0 (Control) | 68 | 12 | 1 | 99.93 |
| 2 | 1 | 1 | 1 | 99.93 |
| 6 | 1 | 1 | 1 | 99.93 |
| 10 | 1 | 1 | 1 | 99.93 |
| 16 | 1 | 1 | 1 | 99.93 |

[1]determined by GC analysis of the sample.
Percent refers to % by area from the GC curve.

Example 3

The procedure of Example 2 was followed, except that chloride ion level was monitored at the start (Control or unfiltered sample), and after 10 minutes. Initial chlroride ion level is 1.7 ppm, and after 10 minutes, it is below 200 ppb.

Reference Example 1

A 10-ml sample of dimethyl carbonate was first analyzed for sodium, potassium and iron, and then filtered through a 0.2 micrometer ($\mu$m) Teflon™ syringe filter. The results are shown in Table 3. "Control" refers to the unfiltered dimethyl carbonate.

TABLE 3

| Sample | Sodium (ppb) | Potassium (ppb) | Iron (ppb) |
|---|---|---|---|
| Control | 12 | 12 | 233 |
| Filtered dimethyl carbonate | 12 | 10 | 229 |

The data indicate that there is no reduction in trace metal ion levels as a result of using this Teflon™ filter.

Reference Example 2

Dimethyl carbonate (75 grams) was mixed with 2 grams of dry Ecodex™ 202A (a mixed bed cellulose cationic/anionic material, available from Graver Chemical Company) for 2 hours at room temperature and filtered. GC analysis of the filtered material indicated the formation of 0.22% methanol, indicating that the Ecodex™ material causes the partial decomposition of dimethyl carbonate.

Each of the documents referred to above is incorporated herein by reference in its entirety, for all purposes.

Except in the Examples, or where otherwise explicitly indicated, all numerical quantities in this description specifying amounts of materials, reaction conditions (such as temperature), molecular weights, number of carbon atoms, and the like, are to be understood as modified by the word "about."

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A method for producing an acid sensitive liquid composition, said method comprising the step of:

passing an acid sensitive liquid composition comprising a carbonate represented by the formula $ROC(=O)OR^1$ wherein R and $R^1$ independently are a hydrocarbyl group of 1 to about 10 carbon atoms, through at least one of the following two filter sheets:

(a) a filter sheet comprising a self-supporting fibrous matrix having immobilized therein a particulate filter aid and a particulate ion exchange resin, said ion exchange resin having an average particle size of from about 2 to about 10 micrometers ($\mu$m), wherein said particulate filter aid and ion exchange resin particles are distributed substantially uniformly throughout a cross-section of said matrix; and/or (b) a filter sheet comprising a self-supporting matrix of fibers having immobilized therein a particulate filter aid and a binder resin, said filter sheet having an average pore size of about 0.0.05 to 0.5 $\mu$m;

thereby producing the acid sensitive liquid composition; wherein, the ion exchange resin of filter sheet (a) comprises a cation exchange resin, and wherein the filter sheet (b) does not contain any ion exchange resin.

2. The method of claim 1, wherein R and $R^1$ are independently methyl or ethyl.

3. The method of claim 1, wherein the acid sensitive liquid composition further comprises at least one solvent.

4. The method of claim 3, wherein the solvent is at least one member selected from the group consisting of propylene glycol methyl ether acetate (PGMEA), propylene glycol methyl ether (PGME), cyclopentanone, cyclohexanone, and ethyl 2-hydroxypropionate (ethyl lactate).

5. The method of claim 3, wherein both R and $R^1$ are methyl and the solvent is cyclopentanone.

6. The method of claim 5, wherein the liquid composition comprises from about 50 to about 80 weight % of the carbonate, and from about 20 to about 50 weight % of cyclopentanone, based on the total weight of the liquid composition.

7. The method of claim 6, wherein the ratio of the carbonate to cyclopentanone, by weight, is in the range of from about 60:40 to about 80:20.

8. The method of claim 6, wherein the ratio of the carbonate to cyclopentanone is in the range of from about 70:30 to about 80:20.

9. The method of claim 3, wherein both R and $R^1$ are ethyl and the solvent is PGME.

10. The method of claim 9, wherein the ratio of the carbonate to PGME, by weight, ranges from about 60:40 to about 80:20.

11. The method of claim 1, wherein the liquid composition is passed only through filter sheet (a).

12. The method of claim 1, wherein the liquid composition is first passed through filter sheet (a), and is then passed through filter sheet (b).

13. The method of claim 1, wherein the liquid composition is first passed through filter sheet (b), and is then passed through filter sheet (a).

14. The method of claim 1, wherein the cation exchange resin is selected from the group consisting of sulfonated phenol-formaldehyde condensates, sulfonated phenol-benzaldehyde condensates, sulfonated styrene-divinyl benzene copolymers and sulfonated methacrylic acid-divinyl benzene copolymers.

15. The method of claim 1, wherein the ion exchange resin of filter sheet (a) comprises a mixture of a cation exchange resin and an anion exchange resin.

16. The method of claim 1, wherein the particulate filter aid is at least one member selected from the group consisting of diatomaceous earth, magnesia, perlite, talc, colloidal silica, polymeric particles, activated carbon, molecular sieves, and clay.

17. The method of claim 1, wherein the filter sheet (a) further comprises a binder resin.

18. The method of claim 1, wherein the self-supported fibrous matrix of filter sheet (a) comprises a fiber selected from the group consisting of polyacrylonitrile fiber, nylon fiber, rayon fiber, polyvinyl chloride, cellulose fiber and cellulose acetate fiber.

19. The method of claim 1, wherein the particulate filter aid matrix of filter sheet (a) is acid washed.

20. The method of claim 19, wherein the acid is at least one member selected from the group consisting of hydrochloric acid, formic acid, acetic acid, propionic acid, butyric acid, oxalic acid, succinic acid, sulfonic acid, and nitric acid.

21. The method of claim 1, wherein the wherein in the filter sheet (b), the self-supporting fibrous matrix of fibers are selected from the group consisting of polyacrylonitrile fiber, nylon fiber, rayon fiber, polyvinyl chloride, cellulose fiber and cellulose acetate fiber.

22. The method of claim 1, wherein the self-supporting fibrous matrix of fibers are cellulose fibers.

23. The method of claim 1, wherein the filter sheet (b) has an average pore size of about 0.2 $\mu$m.

24. The method of claim 1, wherein the liquid composition, after passing through at least one of the filter sheets (a) and (b), has a concentration of sodium and iron ions that is less than 50 ppb each.

25. The method of claim 1, wherein the liquid composition, after passing through at least one of the filter sheets (a) and (b), has a concentration of sodium and iron ions that is less than 25 ppb each.

26. The method of claim 1, wherein the liquid composition, after passing through at least one of the filter sheets (a) and (b), has a concentration of sodium and iron ions that is less than 10 ppb each.

27. The method of claim 1, wherein the liquid composition, after passing through at least one of the filter sheets (a) and (b), has a halide concentration that is less than 200 ppb.

28. The method of claim 1, wherein the liquid composition, after passing through at least one of the filter sheets (a) and (b), has a concentration of one or more of the following anions that is less than 200 ppb: $NO_2^{-1}$, $NO_3^{-1}$, $PO_4^{-3}$, $SO_4^{-2}$, and $HSO_4^{-1}$.

29. A method for producing an acid sensitive liquid composition, said method comprising the step of:

passing an acid sensitive liquid composition comprising a carbonate represented by the formula $ROC(=O)OR^1$ wherein R and $R^1$ independently are a hydrocarbyl group of 1 to about 10 carbon atoms, through a filter sheet comprising a self-supporting matrix of fibers having immobilized therein a particulate filter aid and a binder resin, said filter sheet having an average pore size of about 0.0.05 to 0.5 $\mu$m and not containing any ion exchange resin; thereby producing the acid sensitive liquid composition.

* * * * *